(12) United States Patent
Joo

(10) Patent No.: US 10,163,473 B2
(45) Date of Patent: Dec. 25, 2018

(54) NONVOLATILE MEMORY DEVICE, SEMICONDUCTOR DEVICE, AND METHOD FOR OPERATING SEMICONDUCTOR DEVICE

(71) Applicant: SK hynix Inc., Gyeonggi-do (KR)

(72) Inventor: Byoung-In Joo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/673,004

(22) Filed: Aug. 9, 2017

(65) Prior Publication Data

US 2017/0337956 A1     Nov. 23, 2017

Related U.S. Application Data

(62) Division of application No. 15/171,539, filed on Jun. 2, 2016, now Pat. No. 9,761,291.

(30) Foreign Application Priority Data

Nov. 27, 2015    (KR) ........................ 10-2015-0167617

(51) Int. Cl.

| G11C 7/10 | (2006.01) |
|---|---|
| G11C 7/22 | (2006.01) |
| G11C 16/04 | (2006.01) |
| G11C 16/10 | (2006.01) |
| G11C 16/14 | (2006.01) |
| G11C 16/24 | (2006.01) |
| G11C 16/26 | (2006.01) |
| G11C 16/32 | (2006.01) |

(52) U.S. Cl.
CPC ................ *G11C 7/22* (2013.01); *G11C 7/10* (2013.01); *G11C 7/222* (2013.01); *G11C 16/0483* (2013.01); *G11C 16/10* (2013.01); *G11C 16/14* (2013.01); *G11C 16/24* (2013.01); *G11C 16/26* (2013.01); *G11C 16/32* (2013.01)

(58) Field of Classification Search
None
See application file for complete search history.

(56) References Cited

U.S. PATENT DOCUMENTS

| 2009/0021993 A1* | 1/2009 | Nakazawa | G11C 8/06 365/189.14 |
|---|---|---|---|
| 2013/0070535 A1* | 3/2013 | Yoo | G11C 16/32 365/189.05 |

* cited by examiner

*Primary Examiner* — Uyen B Tran
(74) *Attorney, Agent, or Firm* — IP & T Group LLP

(57) ABSTRACT

A nonvolatile memory device may include a plurality of cell strings including a plurality of memory cells serially coupled to one another; a plurality of bit lines coupled to a corresponding cell string of the plurality of cell strings; a plurality of page buffers each including a plurality of latches and coupled to a corresponding bit line of the plurality of bit lines; a first control circuit suitable for controlling the plurality of latches to perform an operation corresponding to an activated command signal of a plurality of command signals in an access operation; and a second control circuit suitable for activating one or more of the plurality of command signals, while controlling operations of the plurality of cell strings and the plurality of bit lines in the access operation.

15 Claims, 7 Drawing Sheets

NONVOLATILE MEMORY DEVICE, SEMICONDUCTOR DEVICE, AND METHOD FOR OPERATING SEMICONDUCTOR DEVICE

CROSS-REFERENCE TO RELATED APPLICATIONS

This application is a division of U.S. patent application Ser. No. 15/171,539 filed on Jun. 2, 2016, which claims priority of Korean Patent Application No. 10-2015-0167617, filed on Nov. 27, 2015. The disclosure of each of the foregoing applications is incorporated herein by reference in its entirety.

BACKGROUND

1. Field

Exemplary embodiments of the present invention relate to a nonvolatile memory device, a semiconductor device including the nonvolatile memory device, and a method for operating the semiconductor device.

2. Description of the Related Art

FIG. 1 is a configuration diagram of conductor device.

Referring to FIG. 1, the semiconductor device may include a control circuit 110 and a plurality of internal circuits 120_1 to 120_n.

The control circuit 110 may control the plurality of internal circuits 120_1 to 120_n to perform predetermined operations. In more detail, the control circuit 110 may generate a plurality of control signals CON<0:m> for controlling the plurality of internal circuits 120_1 to 120_n, and may activate the plurality of control signals CON<0:m> in predetermined order so that the plurality of internal circuits 120_1 to 120_n perform an operation corresponding to a command CMD inputted from an external device of the semiconductor device.

In the semiconductor device, among the operations performed by the plurality of internal circuits 120_1 to 120_n, some operations could be performed substantially simultaneously. However, when the plurality of internal circuits 120_1 to 120_n are operated using one control circuit 110, since there is a limitation in the number of control signals CON<0:m> which may be simultaneously controlled by the control circuit 110, it is necessary to sequentially perform operations, which could be performed simultaneously. As a result the operation time of the semiconductor device is increased.

SUMMARY

Various embodiments are directed to a nonvolatile memory device, a semiconductor device including the nonvolatile memory device, and a method for operating the semiconductor device, wherein a plurality of internal circuits of the semiconductor device are controlled using a plurality of control circuits and operations, which may be physically and performed simultaneously, thereby enabling a high speed operation.

In an embodiment, a nonvolatile memory device may include: a plurality of cell strings including a plurality of memory cells serially coupled to one another; plurality of bit lines coupled to a corresponding cell string of the plurality of cell strings; a plurality of page buffers each including a plurality of latches and coupled to a corresponding bit line of the plurality of bit lines; a first control circuit suitable for controlling the plurality of latches to perform an operation corresponding to an activated command signal of a plurality of command signals in an access operation; and a second control circuit suitable for activating one or more of the plurality of command signals, while controlling operations of the plurality of cell strings and the plurality of bit lines in the access operation.

In another embodiment, a semiconductor device may include: at least one first internal circuit suitable for performing a predetermined first operation when one or more first control signals among a plurality of first control signals are activated in a predetermined order; at least one second intern circuit suitable for performing a predetermined second operation when one or more second control signals among a plurality of second control signals are activated in a predetermined order a first control circuit suitable for activating the one or more first control signals among the plurality of first control si gnats in a predetermined order in response to an activated command signal among a plurality of command signals; and a second control circuit suitable for activating the one or more among the plurality of command signals while activating the one or more second control signals among the plurality of second control signals in a predetermined order.

In another embodiment, method for operating semiconductor device including first and second control circuits and a plurality of internal circuits may include: activating, by the second control circuit, a plurality of second control signals in a predetermined order in response to an external command, and activating one or more command signals among a plurality of command signals at a predetermined time point; activating, by the first control circuit, a plurality of first control signals in a predetermined order in response to one or more activated command signals among the plurality of command signals; performing, by a first internal circuit among the plurality of internal circuits, a predetermined operation in response to the plurality of second control signals; and performing, by a second internal circuit among the plurality of internal circuits, a predetermined operation in response to the plurality of first control signals.

According to the present technology, internal circuits of a semiconductor device are operated using a plurality of control circuits and operations are performed simultaneously, so that it is possible to improve the operation speeds of a nonvolatile memory device and the semiconductor device.

DETAILED DESCRIPTION

Figure 1:
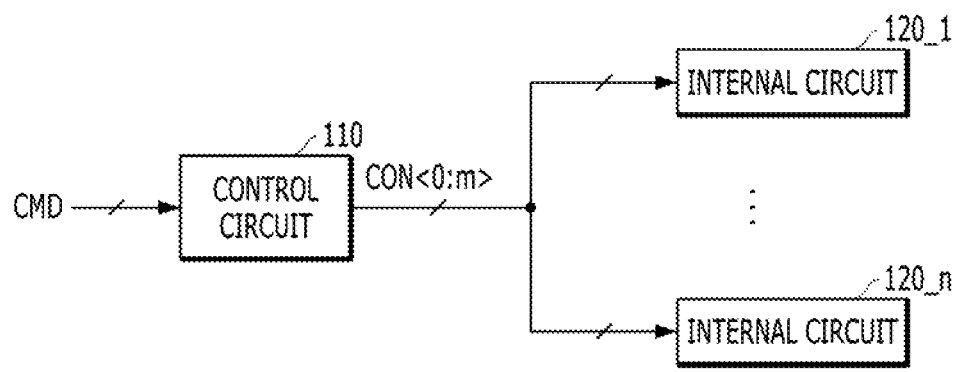
FIG. 1 is a configuration diagram of a conventional semiconductor device including a single control circuit controlling a plurality internal circuits.

Various embodiments will be described below in more detail with reference to the accompanying drawings. The present invention may, however be embodied in different forms and should not be construed as limited to the embodiments set forth herein. Rather, these embodiments are provided so that this disclosure will be thorough and complete and will fully convey the present invention to those skilled in the art. Throughout the disclosure, like reference numerals refer to like parts throughout the various figures and embodiments of the present invention. It will be understood that, although the terms "first", "second", "third", and so on may be used herein to describe various elements, components, regions, layers and/or sections these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present.

The terminology used herein is for the purpose of describing particular embodiments only and not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and or groups thereof. As used herein, the term "and or" includes any and all combinations of one or more of the associated listed it s.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning for example consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, various embodiments of the present disclosure will be described in details with reference to attached drawings.

Figure 2:
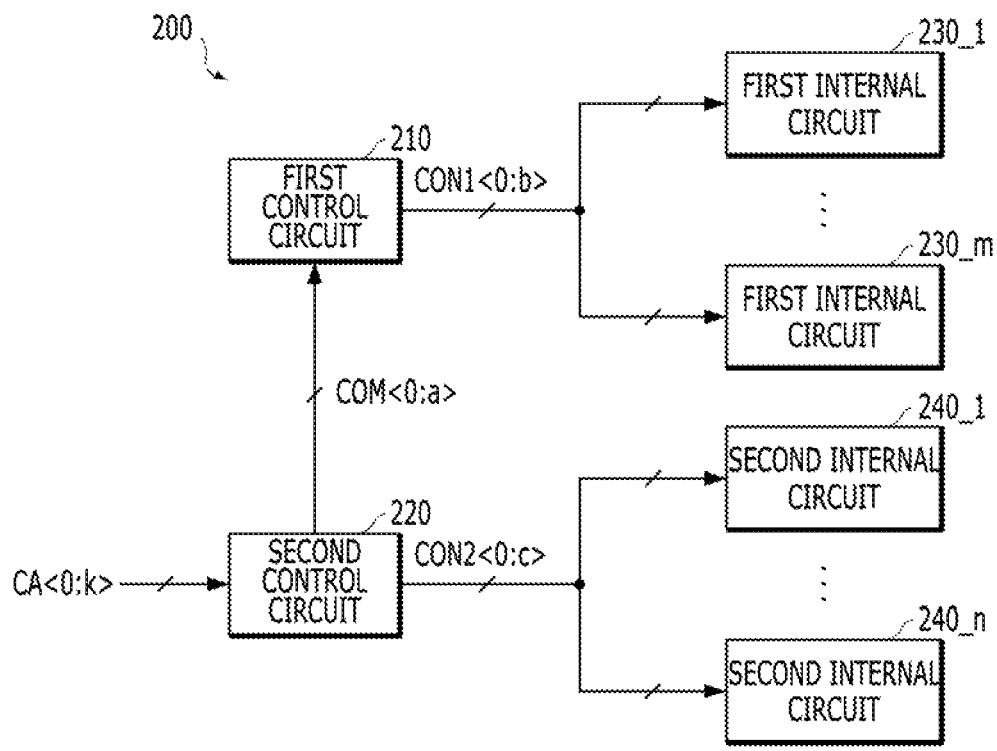
FIG. 2 is a block diagram of a semiconductor device, according to an embodiment of the present invention.

FIG. 2 is a block diagram of a semiconductor device 200, according to an embodiment of the present invention.

Referring to FIG. 2, the semiconductor device 200 may include a first and second control circuits 210, 220, a plurality of first internal circuits 230_1 to 230_m, and a plurality of second internal circuits 240_1 to 240_n.

The first control circuit 210 may activate one or more of the plurality of first control signals CON1<0:b> in a predetermined orderin response to a corresponding activated command signal of plurality of command signals COM<0:a>. In each of the plurality of command signals COM<0:a>, one or more first control signals and activation orders of corresponding first control signals have been set to correspond to each other. Accordingly, when a command signal is activated, the first control circuit 210 may activate first control signals corresponding to the activated command signal in a preset order. The first control circuit 210 may include a finite state machine (hereinafter, referred to as FSM). When a command signal is activated, the FSM may activate predetermined signals at predetermined timings in a predetermined order. The plurality of first control signals CON1<0:b> may be control signals for controlling the first internal circuits 230_1 to 230_m.

The second control circuit 220 may activate one or more of a plurality of second control signals CON2<0:c> in a predetermined order in correspondence to command/address signals CA<0:k> inputted from an external device, and may activate one or more of the plurality of command signals COM<0:a> at predetermined timings. The second control circuit 220 may include a microcontroller ("MC"). The plurality of second control signals CON2<0:c> may control the second internal circuits 240_1 to 240_n.

Each of the first internal circuits 230_1 to 230_m may perform one or more predetermined operations in response to a first control signal CON1<0:b>. Each of the second internal circuits 240_1 to 240_n may perform one or more predetermined operations in response to a second control signal CON2<0:c>. The operations performed by the first and second internal circuits 230_1 to 230_m and 240_1 to 240_n may be sub-operations constituting operations corresponding to the command/address signals CA<0:k> inputted to the semiconductor device 200. The sub-operations performed by the first and the second internal circuits 230_1 to 230_m and 240_1 to 240_n may be performed in a predetermined order. The sub-operations performed by the first and second internal circuits 230_1 to 230_m and may be performed simultaneously. The sub-operations performed by the first and the second internal circuits 230_1 to 230_m and 240_1 to 240_n may at least partially overlap.

For example, a period in which the operations of the first internal circuits 230_1 to 230_m controlled by the first control circuit 210 are performed, and a period in which the operations of the second internal circuits 240_1 to 240_n controlled by the second control circuit 220 are performed, may at least partially overlap each other. Overlapping of the periods, in which two operations are performed, means that at least a part of the two operations are performed simultaneously.

In the semiconductor device 200, the second control circuit 220 may be a main control circuit that controls the entire semiconductor device 200. The first control circuit 210 may be a sub-control circuit that controls only a part of the semiconductor device corresponding to itself. Hence, the semiconductor device 200 may separate the main control circuit from the sub-control circuit to generate all control signals of the semiconductor device 200. This may in turn substantially reduce the size and or complexity of the main control circuit. Furthermore, the semiconductor device 200, may perform simultaneously operations which may be performed simultaneously given the overall processing capability of the semiconductor device, thus reducing the overall operation time and achieving a higher operational speed operation than the conventional semiconductor device of FIG. 1.

Figure 3A:
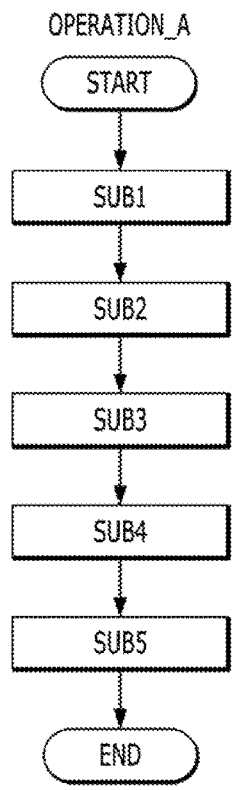
FIG. 3A and FIG. 3B are diagrams comparing an operation of a conventional semiconductor device with an operation of the semiconductor device of FIG. 2.
Figure 3B:
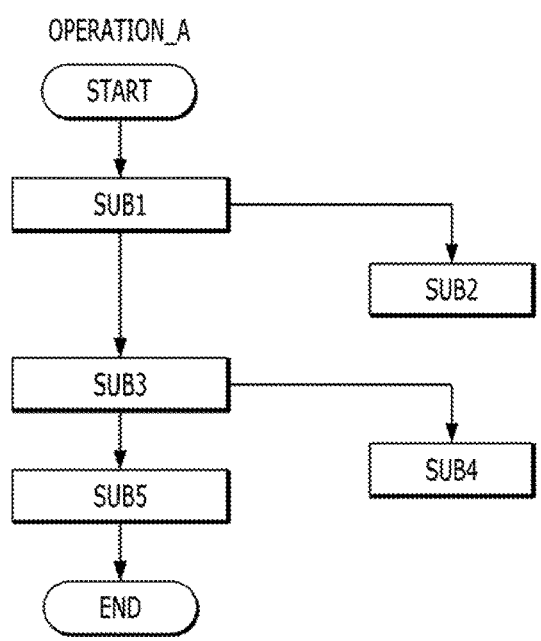

FIGS. 3A and 3B are diagrams comparing an operation of a conventional semiconductor device with an operation of the semiconductor device 200 of FIG. 2. FIG. 3A is a diagram illustrating the operation of the conventional semiconductor device whereas FIG. 3B is a diagram illustrating the operation of the semiconductor device 200 of FIG. 2.

Hereinafter, the case, in which an operation A (OPERATION_A) includes sub-operations 1 to 5 (SUB1 to SUB5) which are performed in a predetermined order, so that the operation A OPERATION_A is achieved, will be described. The entire periods or partial periods of sub-operation 1 (SUB1) and sub-operation 2 (SUB2) may overlap each other. Also, the entire periods or partial periods of sub-operation 3 (SUB3) and sub-operation 4 (SUB4) may overlap each other.

Sub-operation 1 (SUB1), sub-operation 3 (SUB3), and sub-operation 5 (SUB5) may be operations performed by the second internal circuits 240_1 to 240_n under the control of the second control circuit 220, and sub-operation 2 (SUB2) and sub-operation 4 (SUB4) may be operations performed by the first internal circuits 230_1 to 230_m under the control of the first control circuit 210.

Referring to FIG. 3A, the conventional semiconductor device may sequentially perform the sub-operations 1 to 5 (SUB1 to SUB5) in order to perform the operation A (OPERATION_A) corresponding to a predetermined command. However, referring to FIG. 3B, the semiconductor device 200 of FIG. 2, according to an embodiment of the present invention, may perform the sub-operations 1 to 5 (SUB1 to SUB5) in order to perform the operation A (OPERATION_A) in such a manner that the sub-operation 1 (SUB1) and the sub-operation 2 (SUB2) are performed during at least partially overlapping periods and the sub-operation 3 (SUB3) and the sub-operation 4 (SUB4) are performed during at least partially overlapping periods.

For example, the second control circuit 220 may activate a command signal corresponding to the second sub-operation (SUB2) while controlling the second internal circuits 240_1 to 240_n so that the first sub-operation (SUB1) is performed, thereby allowing the first control circuit 210 to control the first internal circuits 230_1 to 230_m so that the second sub-operation (SUB2) is performed, hence, allowing simultaneous performance of the first and second sub-operations SUB1 and SUB2. Furthermore, the second control circuit 220 may activate a command signal corresponding to the fourth sub-operation (SUB4) while controlling the second internal circuits 240_1 to 240_n so that the third sub-operation (SUB3) is performed, thereby allowing the first control circuit 210 to control the first internal circuits 230_1 to 230_m so that the fourth sub-operation (SUB4) is performed, hence, allowing simultaneous performance of the third and fourth sub-operations SUB3 and SUB4.

Figure 4:
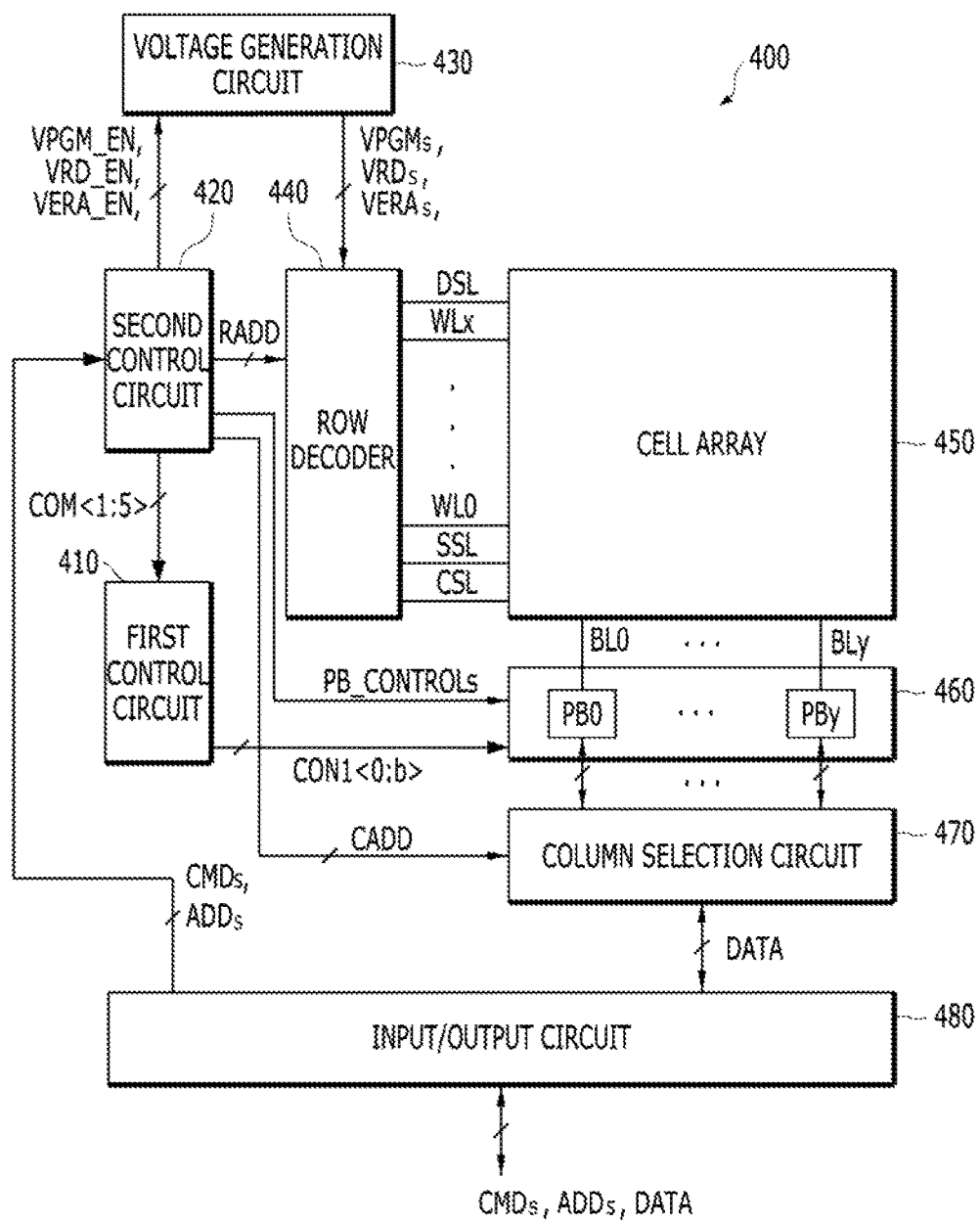
FIG. 4 is a block diagram of a nonvolatile memory device, according to an embodiment of the present invention.

Referring now to FIG. 4, a block diagram of a nonvolatile memory device 400, according to an embodiment of the present invention, is provided.

Accordingly, the nonvolatile memory device 400 may include a first control circuit 410, a second control circuit 420, a voltage generation circuit 430, a row decoder 440, a cell array 450, a page buffer group 460, a column selection circuit 470, and an input/output circuit 480.

Hereinafter, the case, in which first to third latches L1 to L3 included in a plurality of page buffers PB0 to PBy are a first internal circuit controlled by the first control circuit 410 and the other circuits 430, 440, 450, 460, 470, and 480 included in the nonvolatile memory device 400 are a second internal circuit controlled by the second control circuit 420, will be described as an example. The first control circuit 410 may include a FSM and the second control circuit 420 may include a MC.

Figure 5:
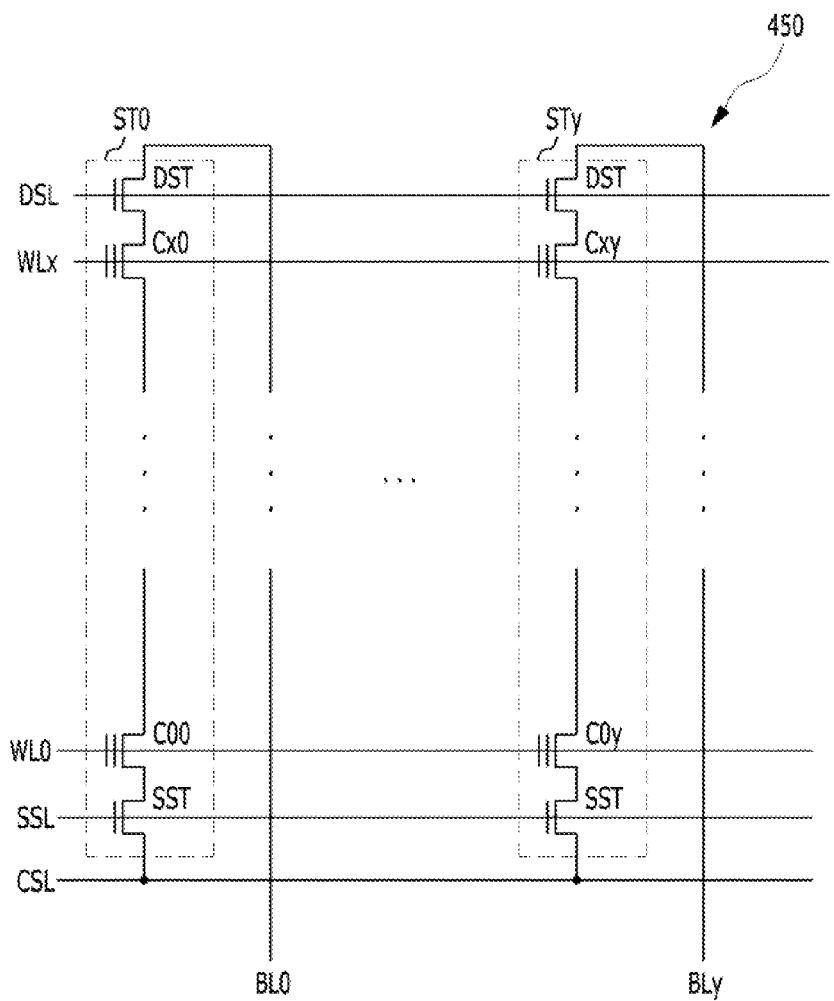
FIG. 5 is a diagram illustrating a part of an example configuration of a cell array 450 of FIG. 4.

FIG. 5 is a diagram illustrating a part oaf an example configuration of the cell array 450 of FIG. 4.

Referring to FIG. 5, each cell array 450 may include a plurality of strings ST0 to STy coupled between bit lines BL0 to BLy and a common source line CSL. For example, the strings ST0 to STy may be coupled to corresponding bit lines BL0 to BLy, respectively. The strings ST0 to STy may be commonly coupled to the common source line CSL. Each of the strings ST0 to STy may include a source selection transistor SST having a source coupled to the common source line CSL, a plurality of memory cells C00 to Cxy, and a drain selection transistor DST having a drain coupled to the bit lines BL0 to BLy. The memory cells C00 to Cxy may be serially coupled between the selection transistors SST and DST. A gate of the source selection transistor SST may be coupled to a source selection line SSL, gates of the memory cells C00 to Cxy may be coupled to word lines WL0 to WLx, respectively, and a gate of the drain selection transistor DST may be coupled to a drain selection line DSL.

Figure 6:
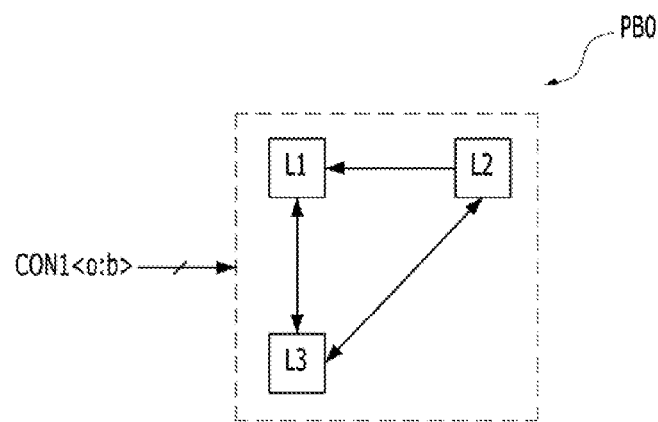
FIG. 6 is a diagram illustrating a part of an example configuration of a page buffer PB0 of FIG. 4.

FIG. 6 is a diagram illustrating part of an example configuration of the page buffer PB0.

Referring to FIG. 6, the page buffer PB0 may include first to third latches L1 to L3. The first latch L1 may store data inputted to the page buffer PB0 from an external device or data to be outputted to the external device from the page buffer PB0. The second latch L2 may store data for controlling the bit line BL0 or data sensed in the bit line BL0. The third latch. L3 may store data to be maintained for a predetermined operation. The configurations and operations the other page buffers PB1 to PBy may be identical or substantially the same as those of the page buffer PB0 described in FIG. 6.

The first control circuit 410 may control the plurality of latches L1 to L3 of the plurality of page buffers PB0 to PBy so that an operation corresponding to an activated command signal of a plurality of command signals COM<1:5> may be performed in the plurality of page buffers PB0 to PBy. For example, the first control circuit 410 may generate the plurality of first control signals CON1<0:b>, and activate one or more first control signals corresponding to the activated command signal in an order corresponding to the activated command signal.

The second control circuit 420 may control the other elements 410, 430, 440, 450, 460, 470, and 480 of the nonvolatile memory device 400 so that the nonvolatile memory device 400 may perform operations corresponding to commands CMDs inputted through the input/output circuit 480 from the external device. The commands CMDs may include a plurality of external command signals, and a combination of the external command signals may indicate the type of the command CMD. The commands CMDs may include a program command, a read command, and an erase command.

The second control circuit 420 may activate a VPGM_EN when the program command is inputted, activate a VRD_EN when the read command is inputted, and activate a VERA_EN when the erase command is inputted. The second control circuit 420 may activate a DIS when an operation corresponding to a command is completed. The second control circuit 420 may control the nonvolatile memory device 200 to perform at least one of a program, read, and erase operations, and activate one or more of the plurality of command signals COM<1:5> so that the first control circuit 410 controls the plurality of latches L1 to L3 in the page buffers PB0 to PBy.

In an access operation, the second control circuit 420 may control voltages VPGMs, VRDs, and VERAs generated by the voltage generation circuit 430 to be applied to the plurality of word lines WL0 to WLx, the source selection line SSL, and the drain selection line DSL through the row decoder 440 as appropriate voltages. The access operation may include at least one of the program, read, and erase operations.

The voltage generation circuit 430 may generate the plurality of operation voltages VPGMs, VRDs, and VERAs. The voltage generation circuit 430 may activate one or more program operation voltages VPGMs when the VPGM_EN is activated. The voltage generation circuit 430 may activate one or more read voltages VRDs when the VRD_EN is activated. The voltage generation circuit 430 may activate one or more erase voltages VERAs when the VERA_EN is activated. The VPGMs may indicate one or more voltages used in the program operation, the VRDs may indicate one or more voltages used in the read operation, and the VERAs may indicate one or more voltages used in the erase operation.

The row decoder 440 may transfer the operation voltages VPGMs, VRDs, and VERAs, which have been outputted from the voltage generation circuit 430, to the lines DSL, WL0 to WLx, SSL, and CSL of the cell array 450 in response to a row address signal RADD of the second control circuit 420. The row address signal RADD may be used to select a word line in the program operation and the read operation. In other words, a word line selected by the row address signal RADD and a non-selected line may be distinguished from each other.

The page buffer group 460 may include the plurality of page buffers PB0 to PBy coupled to the cell array 450 through the bit lines BL0 to BLy. Initialization and data transmission operations of the first to third latches L1 to L3 included in the page buffers PB0 to PBy of the page buffer group 460 may be controlled by the plurality of first control signals CON1<0:b>, while other operations may be controlled by page buffer control signals PB_CONTROLs generated by the second control circuit 420.

The column selection circuit 470 may select the page buffers PB0 to PBy included in the page buffer group 460 in response to a column address CADD outputted from the second control circuit 420. For example, in a program operation the column selection circuit 470 sequentially transfers data, which is to be programmed in memory cells of the cell array 450, to the page buffers PB0 to PBy in response to the column address CDD. Furthermore, in a read operation, the column selection circuit 470 may sequentially select the page buffers PB0 to PBy in response to the column address CADD so that data read from the cell array 450 and stored in the page buffers PB0 to PBy may be outputted to the external of the nonvolatile memory device 400.

The input/output circuit 480 may receive the commands CMDs and addresses ADDS from an external device coupled with the nonvolatile memory device 200, and receive data to be programmed or output read data. In a program operation, the input/output circuit 480 transfers data inputted from the external device to be programmed in memory cells of the cell array 450, to the column selection circuit 470. Furthermore, in a read operation, the input/output circuit 480 may output the data transferred from the column selection circuit 470 to the external device.

Hereinafter, with reference to FIG. 7A, FIG. 7B, FIG. 8A, FIG. 8B, FIG. 9A and FIG. 9B, an operation of the nonvolatile memory device 400 of FIG. 4 will be further described.

Figure 7A:
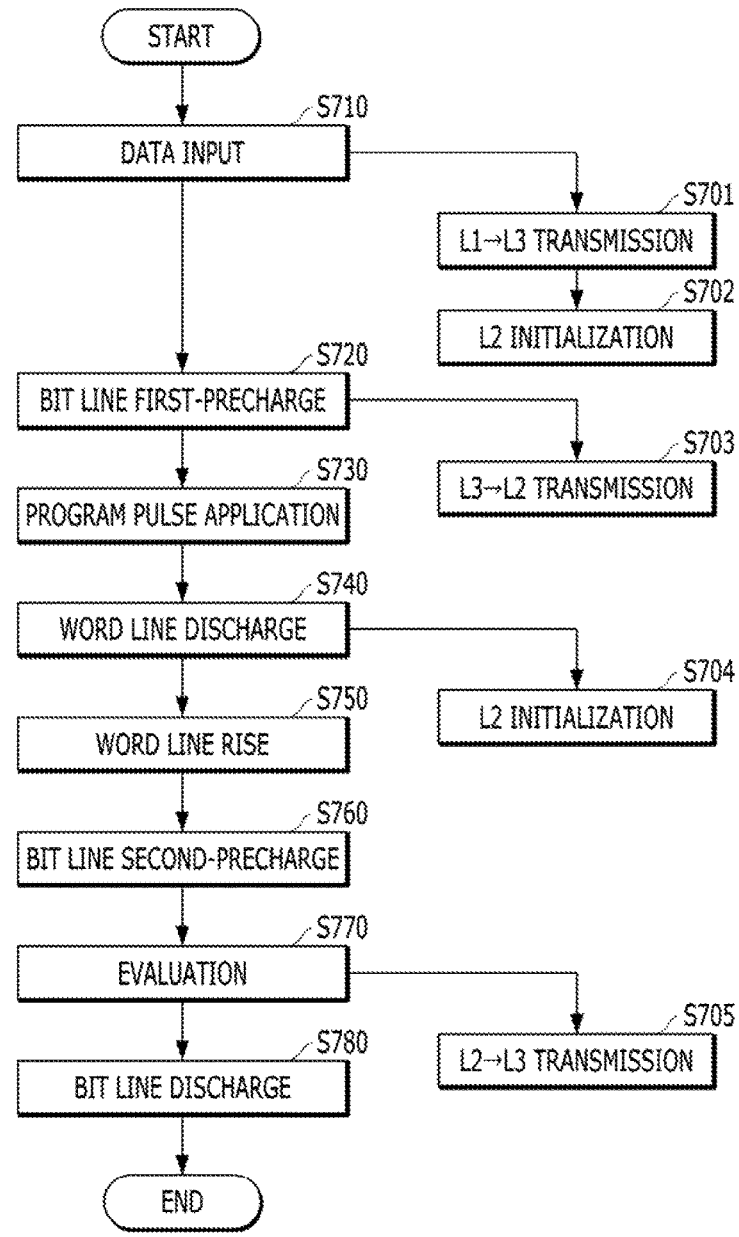
FIG. 7A is a flow diagram illustrating a program operation of a nonvolatile memory device, according to an embodiment of the present invention.
Figure 7B:
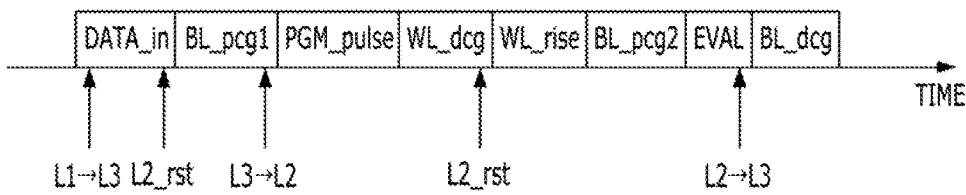
FIG. 7B is a timing diagram illustrating a program operation of a nonvolatile memory device, according to an embodiment of the present invention.

FIG. 7A is a flow diagram illustrating a program operation of the nonvolatile memory device, according to an embodiment of the present invention. FIG. 7B is a timing diagram illustrating a program operation of the nonvolatile memory device, according to an embodiment of the present invention.

Referring to FIGS. 7A and 7B, the program operation may include a data input operation S710 (DATA_in), a bit line first-precharge operation S720 (BL_pcg1), a program pulse application operation S730 (PGM_pulse), a word line discharge operation S740 WL_dcg), a word line rise operation S750 (WL_rise), a bit line second-precharge operation S760 (BL_pcg2), an evaluation operation S770 (EVAL), a bit line discharge operation S780 (BL_dcg), and initialization and data transmission operations S701 to S705 (L1→L3, L2_rst, L3→L2, L2_rst, and L2→L3) of the first to third latches L1 to L3.

In the data input operation S710 (DATA_in), the second control circuit 420 may control data inputted through the input/output circuit 480 to be stored in the page buffers PB0 to PBy and sequentially activate a first command signal COM<1> and a second command signal COM<2> at predetermined time points. The first control circuit 410 may control (S701, L1→L3) data stored in the first latch L1 to be transmitted to and stored in the third latch L3 in response to the first command signal COM<1>. The first control circuit 410 may control (S702, L2_rst the second latch L2 to be initialized in response to the second command signal COM<2>. The initialization may represent that initial data is stored in the second latch L2.

In the bit line first-precharge operation S720 (BL_pcg1), the second control circuit 420 may control the bit lines BL0 to BLy, to which the respective page buffers PB0 to PBy correspond, to be precharged to a voltage level decided by data stored in the second latch L2. The second control circuit 420 may activate a third command signal COM<3> while performing an operation required for precharging a bit line. The operation required for precharging a bit line may include an operation in which a voltage for turning on the drain selection transistor DST is applied to the drain selection line DSL, and an operation in which a voltage for turning off the source selection transistor SST is applied to the source selection line SSL and a power supply voltage is applied to the common source line CSL.

The first control circuit 410 may control (S703, L3→L2) the data stored in the third latch. L3 to be transmitted to and stored in the second latch L2 in response to the third command signal COM<3>. The second control circuit 420 may control the data stored in the third latch L3 to be transmitted to the second latch L2 and then control a bit line to be precharged to the voltage level decided by the data stored in the second latch L2.

A bit line coupled to a memory cell, for which program is permitted, may be precharged to a prohibition voltage (for example, 0 V), and a bit line corresponding to a memory cell for which program is prohibited, may be precharged to a prohibition voltage (for example, VCC).

In the program pulse application operation S730 (PGM_pulse), the second control circuit 420 may control a program pulse having a first voltage level to be applied to a selected word line and a pass voltage having a second voltage level for turning on a memory cell to be applied to a unselected word line. As a consequence, a threshold voltage of the memory cell, for which program is permitted, may increase.

In the word line discharge operation S740 (WL_dcg), the second control circuit 420 may control the charge of a word line having a voltage level increased due to the application of the program pulse and the turn-on voltage to be discharged and a voltage of the word line to be lowered.

Then, the second control circuit 420 may perform a verification operation in order to confirm whether a memory cell has been programmed. In the word line rise operation S750 (WL_rise), the second control circuit 420 may activate the second command signal COM<2> while controlling different voltages to be applied to the selected word line and the unselected word line. The first control circuit 410 may initialize (S704, L2_rst) the second late L2, in response to the first command signal COM<1>.

In the bit line second-precharge operation S760 (BL_pcg2), the second control circuit 420 may control a bit line to be precharged to a predetermined voltage level. Unlike the bit line first-precharge operation S720 (BL_pcg1), in the bit line second-precharge operation S760 (BL_pcg2), all bit lines may be precharged to substantially the same voltage level.

In the evaluation operation S770 (EVAL), the second control circuit 420 may control a voltage for turning on the selection transistors DST and SST to be applied to the selection lines DSL and SSL, control a ground voltage to be applied to the common source line CSL, control voltage for verifying a target program level to be applied to the word lines WL0 to WLx, sense data of a memory cell selected through a bit line after a predetermined time lapses, and activate a fourth command signal COM<4> while controlling the data to be stored in the second latch L2. When the fourth command signal COM<4> is activated, the first control circuit 410 may control (S705, L2→L3) the data of the second latch L2 to be transmitted to and stored in the third latch L3. The transmission of the data may be performed after the data of the memory cell sensed through the bit line is stored in the second latch L2.

In the bit line discharge operation S780 (BL_dcg), the second control circuit 420 may control all bit lines precharged for evaluation to be discharged to a predetermined voltage, level. Then, the second control circuit 420 may determine whether programming of a memory cell has been completed according to the value of the data stored in the third latch L3, and repeat or end the program operation according to the determination result.

Figure 8A:
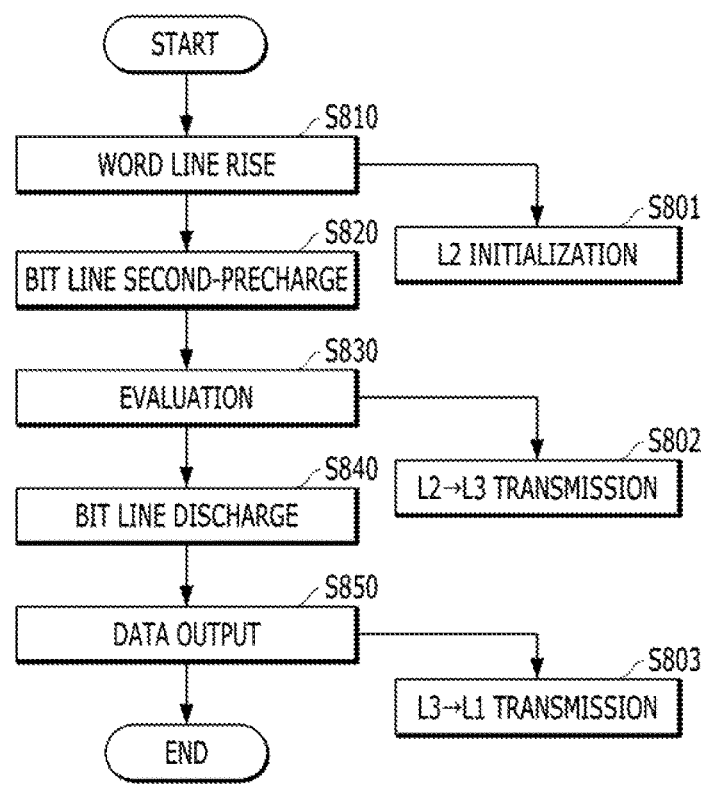
FIG. 8A is flow diagram illustrating a read operation of a nonvolatile memory device according to an embodiment of the present invention.
Figure 8B:
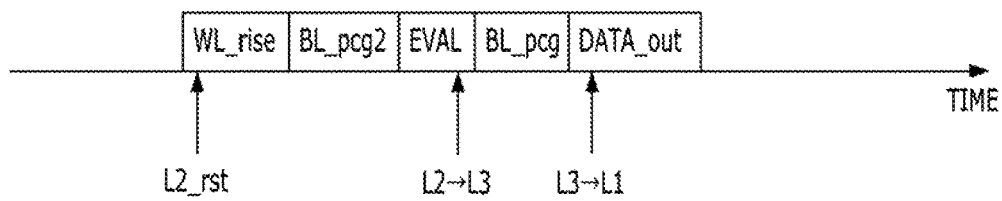
FIG. 8B is a timing diagram illustrating a read operation of a nonvolatile memory device according to an embodiment of the present invention.

FIG. 8A is a flow diagram illustrating a read operation of the nonvolatile memory device, according to an embodiment of the present invention. FIG. 8B is a timing diagram for a read operation of the nonvolatile memory device, according to an embodiment of the present invention.

Referring to FIGS. 8A and 8B, the read operation may include a word line rise operation S810 (WL_rise), a bit line second-precharge operation S820 (BL_pcg2)₁ an evaluation operation S830 (EVAL), a bit line discharge operation S840 (BL_dcg), a data output operation S850 (DATA_out), and initialization and data transmission operations S801 to S803 (L2_rst, L2→L3, and L3→L1) of the first to third latches L1 to L3.

In the word line rise operation S810 (WL_rise), the second control circuit 420 may activate the second command signal COM<2> while controlling different voltages to be applied to a selected word line and an unselected word line. The first control circuit 410 may initialize (S801, L2_rst) the second latch L2 in response to the second command signal COM<2>.

In the bit line second-precharge operation S820 (BL_pcg2), the second control circuit 420 may control a bit line to be precharged to a predetermined voltage level. In the bit line second-precharge operation S820 (BL_pcg2), all bit lines may be precharged to substantially the same voltage level.

In the evaluation operation S830 (EVAL), the second control circuit 420 may control a voltage for turning on the selection transistors DST and SST to be applied to the selection lines DSL and SSL, control a ground voltage to be applied to the common source line CSL, control a voltage for verifying a target program level to be applied to the word lines WL0 to WLx, sense data of a memory cell selected through a bit line after a predetermined time lapses, and activate the fourth command signal COM<4> while controlling the data to be stored in the second latch L2. When the fourth command signal COM<4> is activated, the first control circuit 410 may control (S802, L2→L3) the data of the second latch L2 to be transmitted to and stored in the third latch L3. The transmission of the data may be performed after the data of the memory cell sensed through the bit line is stored in the second latch L2.

In the bit line discharge operation S840 (BL_dcg), the second control circuit 420 may control all bit lines precharged for evaluation to be discharged to a predetermined voltage level.

In the data output operation S850 (DATA_out), the second control circuit 420 may control the data stored in the page buffers PB0 to PBy (i.e., the data stored in the first latch L1) to be outputted to an external device coupled with the nonvolatile memory device 400 through the input/output circuit 480 and control a fifth command signal COM<5> to be activated. The first control circuit 410 may control (S803 L3→L1) the data stored in the third latch L3 to be transmitted to and stored in the first latch L1 in response to the fifth command signal COM<5>. S803 is performed by the second control circuit 420 before the data is outputted from the first latch L1, so that the data outputted from the first latch L1 may be data sensed through the evaluation operation S830 (EVAL).

Figure 9A:
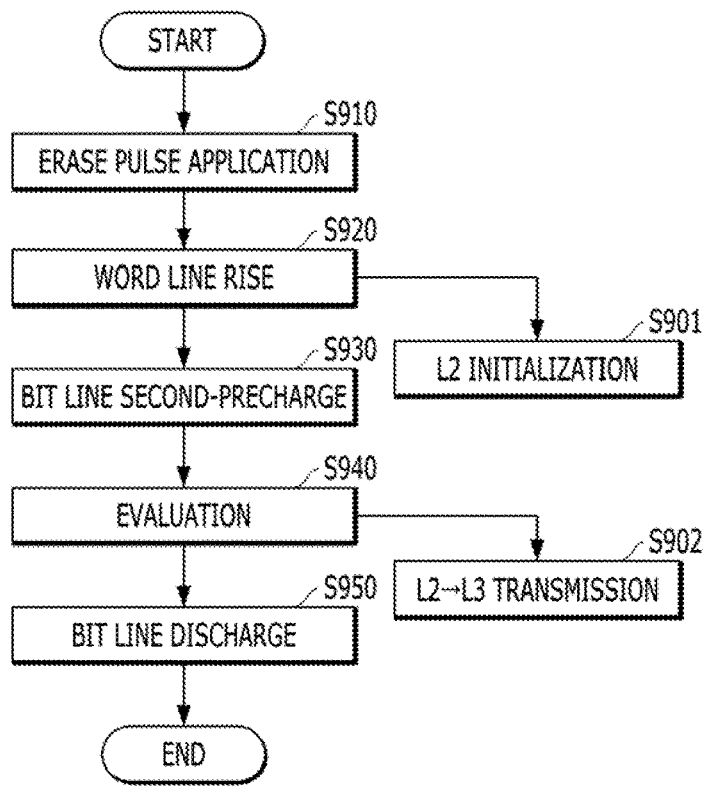
FIG. 9A is flow diagram illustrating an erase operation of a nonvolatile memory device, according to an embodiment of the present invention.
Figure 9B:
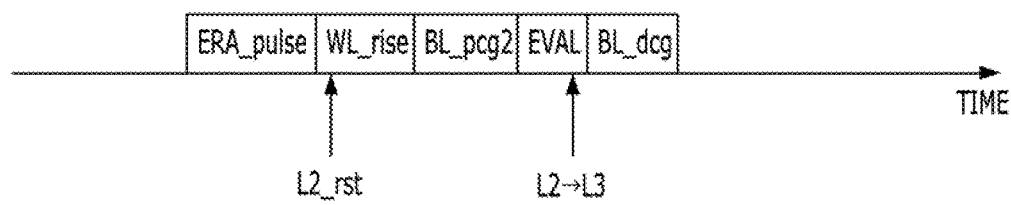
FIG. 9B is a timing diagram illustrating an erase operation of a nonvolatile memory device, according to an embodiment of the present invention.

FIG. 9A is a flow diagram illustrating an erase operation of the nonvolatile memory device, according to an embodiment of the present invention. FIG. 9B is a timing diagram for an erase operation of the nonvolatile memory device, according to an embodiment of the present invention.

Referring to FIGS. 9A and 9B, the erase operation may include an erase pulse application operation S910 (ERA_pulse), a word line rise operation S920 (WL_rise), a bit line second-precharge operation S930 (BL_pcg2), an evaluation operation S940 (EVAL), a bit line discharge operation S950 (BL_dcg), and initialization and data transmission operations S901 and S902 (L2_rst and L2→L3) of the first to third latches L1 to L3.

In the erase pulse application operation S910 (ERA_pulse), the second control circuit 420 may control the selection lines DSL and SSL to be in a floating state, control an erase permission voltage (for example, 0 V) to be applied to the word lines WL0 to WLx, and control an er voltage to be applied to a bulk (for example a substrate or a P well).

In the word line rise operation S920 (WL_rise), the second control circuit 420 may activate the second command signal COM<2> while controlling different voltages to be applied to a selected word line and an unselected word line. The first control circuit 410 may initialize (S901 L2_rst) the second latch L2 in response to the second command signal COM<2>.

In the bit line second-precharge operation S930 (BL_pcg2), the second control circuit 420 may control a bit line to be precharged to a predetermined voltage level. In the bit line second-precharge operation S930 (BL_pcg2), all bit lines may be precharged to substantially the same voltage level.

In the evaluation operation S940 (EVAL), the second control circuit 420 may control a voltage for turning on the selection transistors DST and SST to be applied to the selection lines DSL and SSL, control a ground voltage to be applied to the common source line CSL, control a voltage for verifying a target erase level to be applied to the word lines WL0 to WLx, sense data of a memory cell selected through a bit line after a predetermined time lapses, and activate the fourth command signal COM<4> while controlling the data to be stored in the second latch L2. When the fourth command signal COM<4> is activated, the first control circuit 410 may control (S902, L2→L3) the data of the second latch L2 to be transmitted to and stored in the third latch L3. The transmission of the data may be performed after the data of the memory cell sensed through the bit line is stored in the second latch L2.

In the bit line discharge operation S950 (BL_dcg), the second control circuit 420 may control all bit lines precharged for evaluation to be discharged to a predetermined voltage level. Then, the second control circuit 420 may determine whether erase of a memory cell to be erased has been completed according to the value of the data stored in the third latch L3, and repeat or end the erase operation according to the determination result.

As described above, the nonvolatile memory device 400 of FIG. 4 can control the first to third latches L1 to L3 by using the first control circuit 410 and control the other elements by using the second control circuit 420, thereby simultaneously performing the operations of the other elements and the initialization or data transmission operations of the first to third latches L1 to L3. Consequently, an operation time is reduced, so that it is possible to increase an operation speed of the nonvolatile memory device.

Although various embodiments have been described for illustrative purposes, it will be apparent to those skilled in the art that various changes and modifications may be made without departing from the spirit and/or scope of the invention as defined in the following claims.

What is claimed is:

1. A semiconductor device comprising:
at least one first internal circuit suitable for performing a predetermined first operation when one or more first control signals among a plurality of first control signals are activated in a first predetermined order;
at least one second internal circuit suitable for performing a predetermined second operation when one or more second control signals among a plurality of second control signals are activated in a second predetermined order;
a first control circuit suitable for activating the one or more first control signals among the plurality of first control signals in the first predetermined order in response to activating of one or more command signals among a plurality of command signals; and
a second control circuit suitable for activating the one or more command signals among the plurality of command signals while activating the one or more second control signals among the plurality of second control signals in the second predetermined order,
wherein the at least one first internal circuit receives only the one or more first control signals from the first control circuit, and the at least one second internal circuit receives only the one or more second control signals from the second control circuit.

2. The semiconductor device of claim 1, wherein a whole or a part of a period, in which the at least one first internal circuit performs the predetermined first operation, overlaps a whole or a part of a period in which the at least one second internal circuit performs the predetermined second operation.

3. The semiconductor device of claim 1, wherein the semiconductor device is a nonvolatile memory device, the nonvolatile memory device includes a voltage generation circuit, a cell array, a peripheral circuit for controlling the cell array, and a plurality of page buffers,
the at least one first internal circuit includes the plurality of page buffers, and the at least one second internal circuit includes the voltage generation circuit, the cell array, and the peripheral circuit.

4. The semiconductor device of claim 3, wherein each of the plurality of page buffers includes first to third latches, wherein the first control circuit performs at least one among controlling data of the first latch to be transmitted to the third latch, controlling the second latch to be initialized, controlling data of the third latch to be transmitted to the second latch, and controlling data of the second latch to be transmitted to the third latch while the second control circuit activates the one or more second control signals for performing at least one among a program operation, a read operation and an erase operation.

5. The semiconductor device of claim 4, wherein, when the nonvolatile memory device performs a program operation,
the second control circuit controls a data input operation, a bit line first-precharge operation, a program pulse application operation, a word line discharge operation, a word line rise operation, a bit line second-precharge operation, an evaluation operation, and a bit line discharge operation to be sequentially performed for the program operation,
activates a first command signal and a second command signal of the plurality of command signals at a predetermined interval in the data input operation, activates a third command signal in the bit line first-precharge operation, activates the second command signal in the word line rise operation, and activates a fourth command signal in the evaluation operation, and
the first control circuit controls data of the first latch to be transmitted to the third latch when the first command signal is activated, controls the second latch to be initialized when the second command signal is activated, controls data of the third latch to be transmitted to the second latch when the third command signal is activated, and controls data of the second latch to be transmitted to the third latch when the fourth command signal is activated.

6. The semiconductor device of claim 4, wherein, when the nonvolatile memory device performs the read operation, the second control circuit controls the word line rise operation, the bit line second-precharge operation, the evaluation operation, the bit line discharge operation, and a data output operation to be sequentially performed for the read operation, activates the second command signal in the word line rise operation, activates the fourth command signal in the evaluation operation, and activates a fifth command signal in the bit line discharge operation, and the first control circuit controls the data of the third latch to be transmitted to the first latch when the fifth command signal is activated.

7. The semiconductor device of claim 4 wherein, when the nonvolatile memory device performs the erase operation, the second control circuit controls an erase pulse application operation, the word line rise operation, the bit line second-precharge operation, the evaluation operation, and the bit line discharge operation to be sequentially performed for the erase operation, activates the second command signal in the word line rise operation, and activates the fourth command signal in the evaluation operation.

8. The semiconductor device of claim 1, wherein the first control circuit includes a finite state machine and the second control circuit includes a microcontroller.

9. A method for operating a semiconductor device including first and second control circuits and a plurality of internal circuits, comprising:

activating, by the second control circuit, a plurality of second control signals in a second predetermined order in response to an external command, and activating one or more command signals among a plurality of command signals at a predetermined time point;

activating, by the first control circuit, a plurality of first control signals in a first predetermined order in response to the one or more activated command signals among the plurality of command signals;

receiving, by a first internal circuit among the plurality of internal circuits, only the plurality of first control signals from the first control circuit;

performing, by the first internal circuit, a first predetermined operation in response to the plurality of first control signals; and receiving, by a second internal circuit among the plurality of internal circuits, only the plurality of second control signals from the second control circuit; and performing, by the second internal circuit, a second predetermined operation in response to the plurality of second control signals.

10. The method of claim 9, wherein a whole or a part of a period, in which the first internal circuit performs the first predetermined operation in response to the plurality of first control signals, overlaps a whole or a part of a period in which the second internal circuit performs the second predetermined operation in response to the plurality of second control signals.

11. The method of claim 10, wherein the semiconductor device is a nonvolatile memory device, the nonvolatile memory device includes a voltage generation circuit, a cell array, a peripheral circuit for controlling the cell array, and a plurality of page buffers, the first internal circuit which performs the second predetermined operation in response to the plurality of first control signals, include the plurality of page buffers, and the second internal circuit which performs the predetermined operation in response to the plurality of second control signals, include the voltage generation circuit, the cell array, and the peripheral circuit.

12. The method of claim 9, wherein each of the plurality of page buffers includes first to third latches, wherein the first control circuit performs at least one among controlling data of the first latch to be transmitted to the third latch, controlling the second latch to be initialized, controlling data of the third latch to be transmitted to the second latch, and controlling data of the second latch to be transmitted to the third latch while the second control circuit activates the one or more second control signals for performing at least one among a program operation, a read operation and an erase operation.

13. The method of claim 12, wherein, when the nonvolatile memory device performs a program operation, the second control circuit controls a data input operation, a bit line first-precharge operation, a program pulse application operation, a word line discharge operation, a word line rise operation, a bit line second-precharge operation, an evaluation operation, and a bit line discharge operation to be sequentially performed for the program operation, activates a first command signal and a second command signal of the plurality of command signals at a predetermined interval in the data input operation, activates a third command signal in the bit line first-precharge operation, activates the second command signal in the word line rise operation, and activates a fourth command signal in the evaluation operation, and the first control circuit controls data of the first latch to be transmitted to the third latch when the first command signal is activated, controls the second latch to be initialized when the second command signal is activated, controls data of the third latch to be transmitted to the second latch when the third command signal is activated, and controls data of the second latch to be transmitted to the third latch when the fourth command signal is activated.

14. The method of claim 12, wherein, when the nonvolatile memory device performs the read operation, the second control circuit controls the word line rise operation, the bit line second-precharge operation, the evaluation operation, the bit line discharge operation, and a data output operation to be sequentially performed for the read operation, activates the second command signal in the word line rise operation, activates the fourth command signal in the evaluation operation, and activates a fifth command signal in the bit line discharge operation, and the first control circuit controls the data of the third latch to be transmitted to the first latch when the fifth command signal is activated.

15. The method of claim 12, wherein, when the nonvolatile memory device performs the erase operation, the second control circuit controls an erase pulse application operation, the word line rise operation, the bit line second-precharge operation, the evaluation operation, and the bit line discharge operation to be sequentially performed for the erase operation, activates the second command signal in the word line rise operation, and activates the fourth command signal in the evaluation operation.

* * * * *